US010032594B2

(12) United States Patent
Choe et al.

(10) Patent No.: US 10,032,594 B2
(45) Date of Patent: Jul. 24, 2018

(54) HIGH EFFICIENCY HOLLOW CATHODE AND CATHODE SYSTEM APPLYING SAME

(71) Applicant: Korea Advanced Institute of Science and Technology, Daejeon (KR)

(72) Inventors: Wonho Choe, Daejeon (KR); Youbong Lim, Daejeon (KR); Holak Kim, Daejeon (KR); Jooyoung Park, Daejeon (KR); Jongho Seon, Yongin-si (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 10 days.

(21) Appl. No.: 15/121,502

(22) PCT Filed: Feb. 23, 2015

(86) PCT No.: PCT/KR2015/001685
§ 371 (c)(1),
(2) Date: Aug. 25, 2016

(87) PCT Pub. No.: WO2015/130050
PCT Pub. Date: Sep. 3, 2015

(65) Prior Publication Data
US 2016/0365215 A1 Dec. 15, 2016

(30) Foreign Application Priority Data

Feb. 27, 2014 (KR) ........................ 10-2014-0023495

(51) Int. Cl.
*H01J 37/32* (2006.01)
*H01J 1/02* (2006.01)
*B64G 1/40* (2006.01)

(52) U.S. Cl.
CPC .............. *H01J 1/025* (2013.01); *B64G 1/405* (2013.01); *H01J 37/32596* (2013.01)

(58) Field of Classification Search
None
See application file for complete search history.

(56) References Cited

U.S. PATENT DOCUMENTS 4,339,691 A * 7/1982 Morimiya ............... H01J 27/08
250/281
5,075,594 A * 12/1991 Schumacher ......... H01J 17/063
250/423 R (Continued)

FOREIGN PATENT DOCUMENTS

JP 2004169606 A 6/2004
JP 2011074887 A 4/2011

(Continued)

OTHER PUBLICATIONS

Sengupta, "Destructive Physical Analysis of Hollow Cathodes from the Deep Space 1 Flight Spare Ion Engine 30,000 Hr Life Test", 29th International Electric Propulsion Conference, 2005, pp. 1-17.

Primary Examiner — Douglas W Owens
Assistant Examiner — Srinivas Sathiraju
(74) Attorney, Agent, or Firm — The Webb Law Firm

(57) ABSTRACT

The present invention relates to a high efficiency hollow cathode and a cathode system applying the same, and comprises: a tube comprising at least two refractory metal parts; a gas providing unit and a gas outlet which are respectively formed at the distal ends of the tube; and an insert mounted inside the tube. According to the present invention, since the present invention constitutes a hollow cathode using more than two substances, the present invention can not only enhance thermal stability, lifespan and efficiency, but also can reduce costs accordingly.

10 Claims, 12 Drawing Sheets

(56) References Cited

U.S. PATENT DOCUMENTS

| | | | | |
|---|---|---|---|---|
| 6,064,156 | A * | 5/2000 | Patterson | H01J 1/025 250/423 R |
| 7,368,741 | B2 * | 5/2008 | Melnychuk | B82Y 10/00 250/493.1 |
| 7,642,533 | B2 * | 1/2010 | Partio | B82Y 10/00 250/504 R |
| 8,143,788 | B2 * | 3/2012 | Hofer | B64G 1/405 313/618 |
| 9,406,535 | B2 * | 8/2016 | Berry, III | H01L 21/67069 |
| 2004/0000853 | A1 * | 1/2004 | Kaufman | H01J 1/025 313/339 |
| 2005/0230645 | A1 * | 10/2005 | Melnychuk | B82Y 10/00 250/504 R |
| 2007/0222358 | A1 * | 9/2007 | Shonka | H01J 1/025 313/339 |
| 2008/0023657 | A1 * | 1/2008 | Melnychuk | B82Y 10/00 250/504 R |
| 2010/0176313 | A1 * | 7/2010 | Melnychuk | B82Y 10/00 250/504 R |
| 2014/0227527 | A1 * | 8/2014 | Brors | H01J 27/04 428/411.1 |
| 2014/0354138 | A1 * | 12/2014 | Rand | H01J 1/025 313/153 |
| 2016/0307781 | A1 * | 10/2016 | Berry, III | H01L 21/67069 |

FOREIGN PATENT DOCUMENTS

| | | | | |
|---|---|---|---|---|
| KR | 100483585 | B1 | 4/2005 | |
| KR | 100899549 | B1 | 5/2009 | |
| KR | 100925015 | B1 | 11/2009 | |
| RU | 2299495 | C2 * | 5/2007 | H01J 1/025 |

* cited by examiner

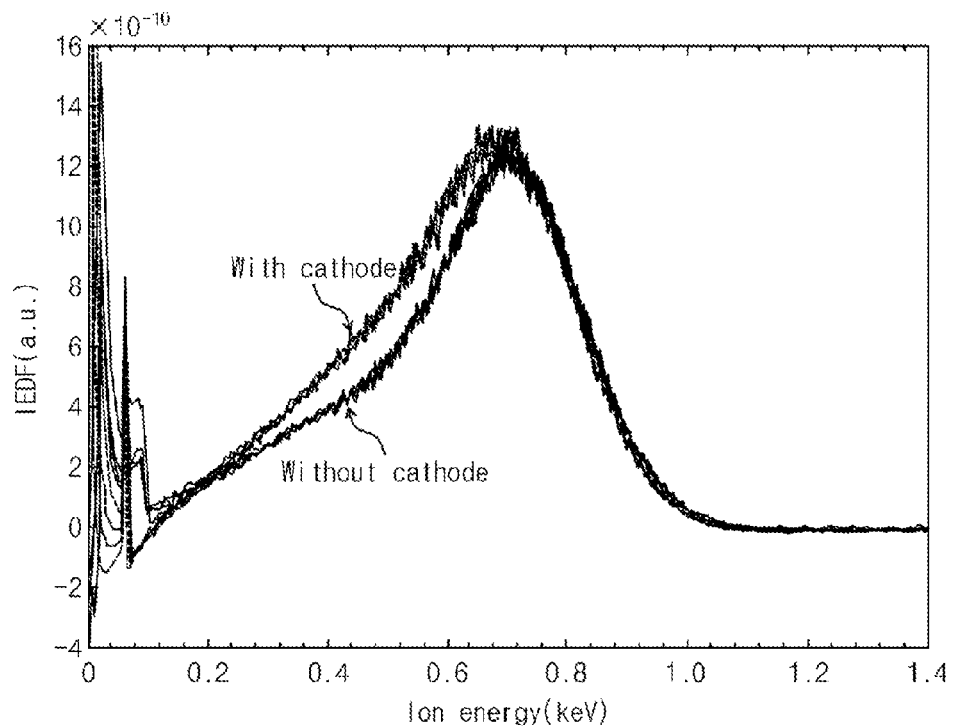

HIGH EFFICIENCY HOLLOW CATHODE AND CATHODE SYSTEM APPLYING SAME

CROSS-REFERENCE TO RELATED APPLICATIONS

This application is the United States national phase of International Application No. PCT/KR2015/001685 filed Feb. 23, 2015, and claims priority to Korean Patent Application No. 10-2014-0023495 filed Feb. 27, 2014, the disclosures of which are hereby incorporated in their entirety by reference.

TECHNICAL FIELD

The present invention relates to a high efficiency hollow cathode and a cathode system applying the same. More specifically, it relates to a high efficiency hollow cathode and a cathode system applying the same, enhancing thermal/electric stability, lifespan and efficiency of the conventional industrial hollow cathode.

BACKGROUND ART

A hollow cathode is an electron beam source which discharges a relatively large amount of thermal electrons through plasma discharge and has a long lifespan.

The conventional industrial hollow cathode, externally, has a tube shape made of a refractory metal, and has an insert (in general, tantalum foil) discharging thermal electrons into the inside of the tube of a single material (in general, tantalum) and multi-layered thermal radiation shielding layers to maintain the insert at a high temperature.

Also, the hollow cathode for an electric condenser for artificial satellites comprises a tube of a refractory metal material, an insert having a low work function (for example, LaB6), a heater for heating the insert and reducing heat loss, and a thermal radiation shielding layer.

The hollow cathode comprises a keeper (electrode) of a disc shape with small holes (for example, a diameter of 0.8 mm) in front of the cathode to discharge thermal electrons, and a body aligning the center axis of the cathode and the keeper and maintaining them at a certain distance.

In order to operate the hollow cathode, power (starter power supply) for outputting a high voltage for initial discharge of plasma between the cathode and keeper, power (keeper power supply) for maintaining the discharge, and a gas providing unit provided to the cathode for plasma discharge are necessary.

Here, in order to apply a negative potential to the cathode for plasma discharge, an electric insulator is used to connect it to the gas providing unit and fix the cathode. In particular, in general an insulation tube (cryogenic break) is used for insulation connection of the cathode with the gas providing line.

Meanwhile, industrial equipment require maintenance at predetermined intervals, and accordingly, the industrial cathode line is inevitably exposed to the atmosphere (in particular, water and oxygen) repetitively. The performance of substances having low work function (for example, LaB6) is greatly deteriorated because the work function increases due to change in physical properties by exposure to the atmosphere.

Thus, the hollow cathode using an insert made of a material with low work function is mainly applied to artificial satellites where there is no concern to be exposed to the atmosphere, and it can operate stably for a long period of time (at least 10,000 hours). However, when applied for industrial use, continuously exposed to the atmosphere, its lifespan drops sharply (to 1,000 hours or below).

The industrial hollow cathode uses a refractory metal (for example, titanium, tungsten, rhenium, hafnium, etc.) stable to exposure to the atmosphere instead of substances having low work function (US 2004/0000853 A1, U.S. Pat. No. 4,339,691 Jul. 13, 1982). In general, tantalum is used in consideration of work function, melting point, thermal conductivity and cost of material, etc.

For the hollow cathode using LaB6 (work function: 3 eV or below) which has a representatively low work function as an insert, there is a possibility that the insert may be thermally damaged by the sharp temperature rise. Thus, the temperature is raised gradually using a heater.

In comparison, the industrial hollow cathode uses refractory metal which is thermally stable. It is possible to raise temperature sharply through plasma discharge by designing an insert with low specific heat (for example, thin foil with a thickness of 0.013 mm), allowing initial discharge using relatively less power.

However, since it has a relatively high work function (as for tantalum, 4.1 eV), it is requested to reach a high temperature (as for tantalum, at least 2,400 K) to discharge thermal electron. This is because the amount of thermal electrons discharged per unit area according to the Richardson's law is $T^2 \exp(-W/kBT)$, and it has an index relation with the work function value. As the required temperature gets higher, the heat loss by thermal radiation greatly increases in proportion to 4 square of the temperature (Stephan Boltzmann Law: $T_{hot}^4 - T_{cold}^4$), and the required power increases sharply.

Thus, the hollow cathode reduces heat loss and power required and enhances thermal stability using a thermal radiation shielding layer of a refractory metal material (in general, tantalum).

However, although the conventional art partly reduces heat loss using a thermal radiation shielding layer, it has a structure that does not sufficiently reduce the heat loss by thermal conduction. This is because a tube of a single material is used, and this has a limitation in reducing heat loss by thermal conduction in terms of production possibility and thermal stability.

For example, a hollow cathode having the same insert does not operate in the same plasma discharge condition when using a molybdenum (thermal conductivity: 138 W/mK) tube which is a metal having a higher thermal conductivity than tantalum (thermal conductivity: 57.5 W/mK), and this is the main reason of the increase in heat loss by conduction.

Using titanium, which is a substance having a relatively lower thermal conductivity (21.9 W/mK) as a tube is advantageous in terms of heat loss, and in terms of cost of material, titanium is advantageous in that it is at least 20 times cheaper than tantalum. However, it cannot be used due to its low melting point (1,941 K).

In comparison, hafnium has a low thermal conductivity (23 W/mK), a low work function (3.9 eV) among the refractory metals, and a sufficiently high melting point (2,506 K). Thus, although it is effective in being applied as a tube and insert of the cathode, due to the extremely expensive cost of the material, it has low competitiveness in the product market when applied to industrial cathodes.

Thus, although the conventional industrial hollow cathode uses tantalum the most based on its physical properties and cost, there is an unnecessary presumption that the cathode should be made of a single material which limits the optimization of the cathode.

Also, the hollow cathode is operated by the principle of raising the temperature of the insert and discharging thermal electrons using plasma discharge (ion bombardment). In this regard, the conventional industrial hollow cathode generally uses a thin refractory metal foil (insert).

In order for the insert to maintain a high temperature, constant heat is delivered from the plasma. This is because of the physical damage caused by continuous ion bombardment with the insert. In particular, thin foil is easily damaged by ion bombardment, deteriorating thermal radiation shielding efficiency. Thus, more power is required and effective area discharging thermal electrons is reduced, thereby reducing the amount of current discharging thermal electrons under the same discharge condition.

In this case, in order for initial discharge of the hollow cathode, a high potential difference is applied between the cathode and keeper (U.S. Pat. No. 5,075,594 Dec. 24, 1991). In this regard, the conventional industrial cathode makes an insulation connection (cryogenic break) with the gas providing line outside the body, so that a large potential is exposed to the outside. Thus, there are problems in electric stability, etc. such that plasma is discharged in the outside.

Also, since the power applying high potential difference (starter power supply) is only used for initial discharge, it is not economic in terms of its usage.

Referring to this in more detail with reference to the attached drawings, FIG. 1 is a cross sectional view illustrating the industrial hollow cathode according to an embodiment of prior art. The industrial hollow cathode 1 comprises a tube 1a and an insert 1b made of tantalum.

Here, the insert 1b may comprise at least one layer (for example, 15 layers) of a thin (for example, a thickness of 0.013 mm) tantalum foil, and perform the role of a thermal radiation shielding layer with respect to the surface discharging inner thermal electrons.

Also, the gas injected from the gas injection hole 1c passes through the insert 1b and gets out of the tube 1a through a small hole 1d, and passes through the cathode through a small hole of the keeper 1e in front of the tube 1a.

In this case, the center axis if of the tube 1a and the keeper 1e hole is arranged to be on the same line so that the thermal electron generated from the tube 1a is easily discharged outside the hollow cathode 1.

FIG. 2 illustrated next is a result calculating the temperature of the industrial hollow cathode according to an embodiment of prior art. It is the result of calculating the temperature in thermal equilibrium state under a condition providing a constant heat source in a plasma discharged between the industrial hollow cathode 1 and keeper 1e by using the equivalent circuit model (ECM) with respect to the heat flow based on the finite element method.

Here, the plasma heat source (35 W) is determined based on a condition where the maximum temperature reaches 2,400 K when the thermal conductivity of the cathode tube 1a is 50 W/mK which is similar to tantalum.

FIG. 3 illustrated next is a result calculating the temperature distribution of the hollow cathode using a tube 1a made of molybdenum in the industrial hollow cathode structure 1 according to an embodiment of prior art.

Here, the thermal conductivity of molybdenum is about 140 W/mK, and due to the relatively high thermal conductivity, the maximum temperature calculated under the same plasma condition (heat source of 35 W) is 2,200 K. In order to reach a temperature of at least 2,400 K, a higher heat source is required.

In case of using a tube made of molybdenum as an experiment, it does not operate under the same discharge condition, and this shows that selecting the material of the cathode tube is important.

FIG. 4 illustrated next is a result calculating the electron discharge probability distribution in the industrial hollow cathode according to an embodiment of prior art.

The density of the thermal electron discharge current is calculated based on the Richardson's Law($J=AT^2 \exp(-U/k_B T)$), and here A is an invariable, T is the surface temperature of the cathode, kB is the Boltzmann constant, and U is the work function. That is, the density is calculated based on the surface temperature of the cathode calculated using ECM and the work function (4.1 eV) of tantalum.

As can be seen in the calculated distribution, it may be confirmed that most thermal electrons are discharged from a couple of the thin foils of the innermost part. Also, since the total thermal electron current discharged increases in proportion to the effective surface area, it may be confirmed that the performance may be enhanced by increasing the effective surface area of the inserted located in the inside.

FIG. 5 illustrated next is a cross sectional view illustrating a cross section of the insert of the industrial hollow cathode according to an embodiment of prior art. The inner insert 1b-1 constituting the innermost surface of the insert 1b is directly exposed to ion bombardment generated by plasma discharge, and thus may be damaged. Due to the damage, the effective surface area discharging thermal electrons is reduced and performance deteriorates.

That is, the conventional technology adopts the form of a thin foil (for example, a thickness of 0.013 mm), and thus may be easily damaged by ion bombardment. Thus, there is a request to enhance its performance.

Also, as for the conventional insert 1b, since the thin foil layer 1b-2 of the outer part is exposed to ion bombardment due to the damaged inner insert 1b-1 and thus the performance of the thermal radiation shielding layer deteriorates, the calorie required to maintain temperature increases, and thus the performance of the cathode deteriorates.

(Patent document 0001) Korean Patent No. 10-0899549
(Patent document 0002) Korean Patent No. 10-0925015

DETAILED DESCRIPTION OF INVENTION

Technical Task

The present invention was derived in order to solve the above problems. It is an object of the present invention to enhance performance and achieve the effect of saving cost by forming the cathode using at least two substances.

Also, it is an object of the present invention to enhance the performance by being formed of a thin wire winding the insert that is inserted into the inside of the tube in the form of solenoid.

Also, it is an object of the present invention to increase electric stability by having the hollow cathode formed of a structure of a thermal insulation connector (cryogenic break) with the gas providing line inside the body.

Also, it is an object of the present invention to increase economic feasibility by using a cheap low power source and electric condenser instead of a high voltage, high power (starter power supply) used for initial discharge.

Means for Solving the Task

In order to achieve the above objects, the hollow cathode comprises a tube comprising at least two refractory metal parts, a gas providing unit and a gas outlet which are respectively formed at the distal ends of the tube, and an insert mounted inside the tube.

Also, the part constituting the tube may be made of refractory metal materials different from each other.

Also, a first part and a second part of the tube may be formed of the same refractory metal material and a third part is formed of a different refractory metal material. The tube may be formed of a tube part of the same or different refractory metal material, and the thickness and diameter of each of the tube part may be made to be the same or different.

Here, a thermal radiation insulation layer may be formed at an interval in the outer side of the tube where the insert is located.

Also, the tube may be formed of a tube part made of titanium, titanium alloy, tantalum material or a combination thereof.

Also, part of or the entire insert may be formed of refractory metal wire.

In this case, the insert may comprise a wire type insert and a foil type insert, and the innermost layer or inner layers may be formed of the wire type insert and the outer part thereof is formed of the foil type insert.

A cathode system using a high efficiency hollow cathode comprises: a body; a keeper electrically connected to one end of the body; any one hollow cathode of claims 1 to 8 mounted in the body; an injection hole injecting gas to the hollow cathode; a ceramic structure coinciding the hollow cathode with the center of the keeper; and a wire connected to the body, the wire providing a large potential difference between the keeper and the hollow cathode.

Also, the hollow cathode may be mounted inside the body, and the cathode may be insulated from the gas injection hole so that cathode potential is not exposed outside the body.

Also, the cathode system may comprise a power unit using an electric condenser for initial discharge.

Advantageous Effect

According to the present invention, since the present invention constitutes a hollow cathode using at least two substances, the present invention can not only enhance thermal stability, lifespan and efficiency, but also can reduce costs accordingly.

Also, the performance such as thermal stability, lifespan and efficiency, etc. may be enhanced by being formed of a thin wire type winding the insert inserted inside the tube in the form of solenoid.

Also, it is an object to increase electric stability by having the hollow cathode formed of a structure of an insulation connection (cryogenic break) with the gas providing line inside the body.

Also, by using a cheap low power source and electric condenser instead of a high voltage, high power (starter power supply) used for initial discharge, not only economic feasibility can be increased, but also the volume and weight of the power unit may be saved, which is one of the most important design elements when applying the hollow cathode to artificial satellites.

BRIEF DESCRIPTION OF DRAWINGS

FIGS. 15a and 15b are graphs illustrating the energy distribution function of discharge image and ion beam obtained by applying the hollow cathode according to an embodiment of the present invention to an ion beam source.

EMBODIMENTS FOR CARRYING OUT THE INVENTION

Hereinafter, embodiments of the present invention will be explained in detail with reference to the accompanying drawings. However, the present invention is not limited or restricted by the following embodiments, and all combinations explained in the following embodiments are not necessarily essential to the technical solution of the present invention.

Figure 1:
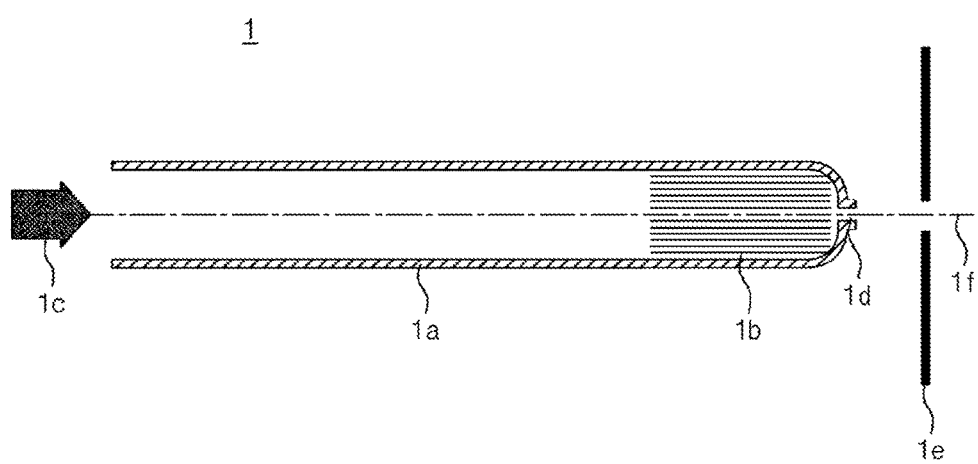
FIG. 1 is a cross sectional view illustrating the industrial hollow cathode according to an embodiment of prior art.
Figure 2:
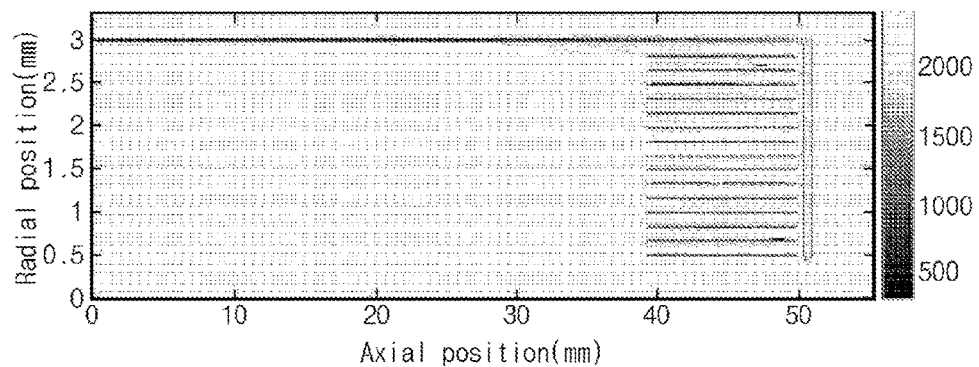
FIG. 2 is a result calculating the temperature of the industrial hollow cathode according to an embodiment of prior art.
Figure 3:
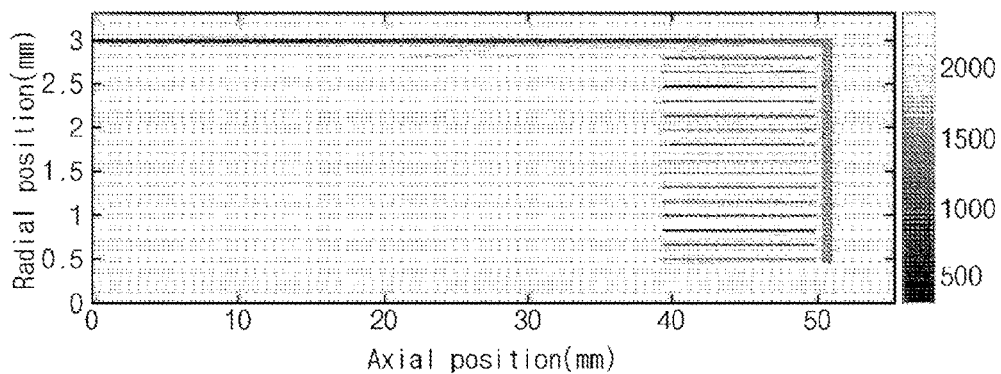
FIG. 3 is a result calculating the temperature distribution of the hollow cathode using a tube made of molybdenum in the industrial hollow cathode structure according to an embodiment of prior art.
Figure 4:
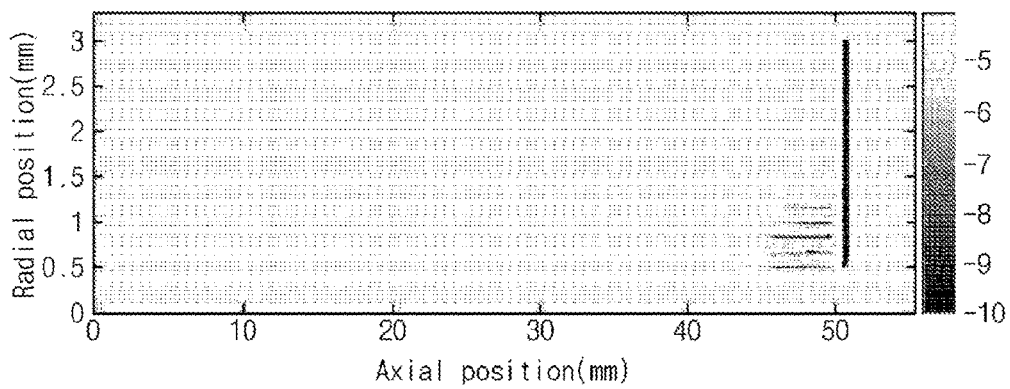
FIG. 4 is a result calculating the electron discharge probability distribution in the industrial hollow cathode according to an embodiment of prior art.
Figure 5:
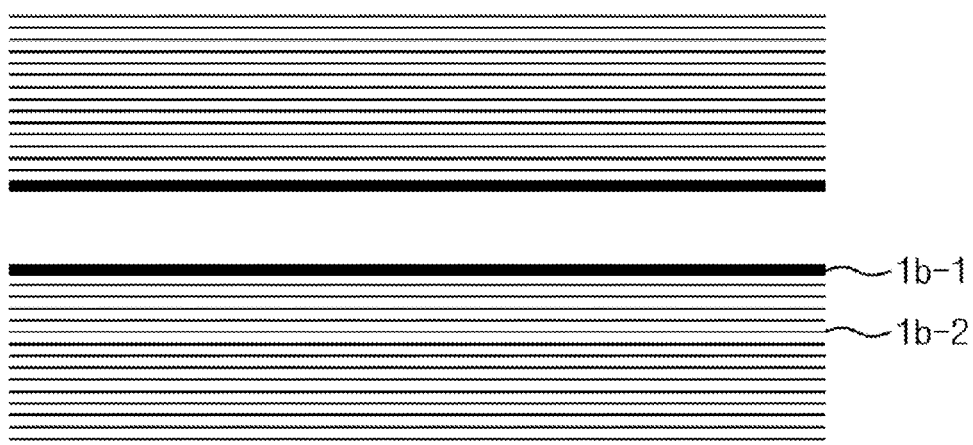
FIG. 5 is a cross sectional view illustrating a cross section of the insert of the industrial hollow cathode according to an embodiment of prior art.
Figure 6:
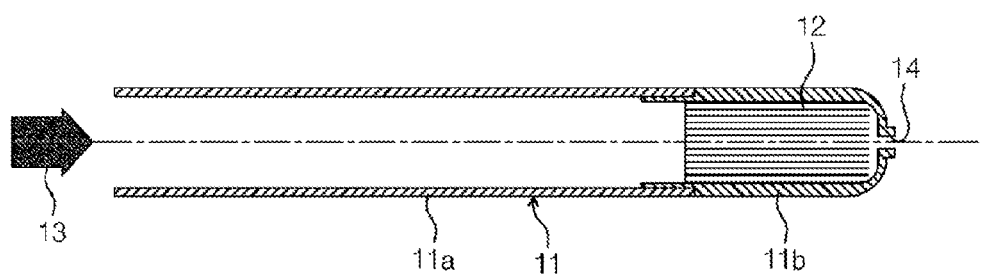
FIG. 6 is a cross sectional view illustrating the hollow cathode structure according to the present invention.
Figure 7:
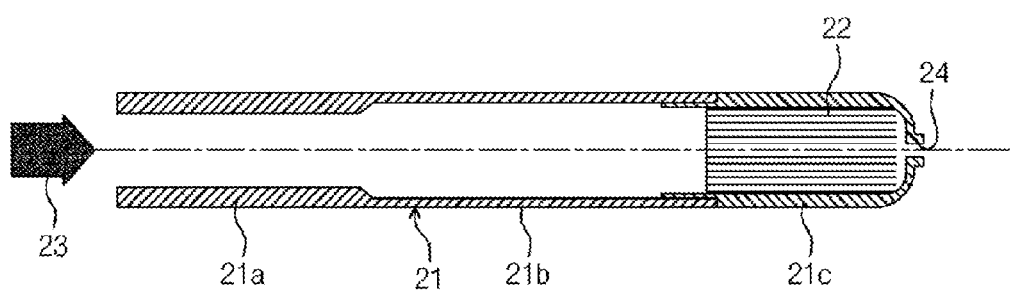
FIG. 7 is a cross sectional view illustrating another embodiment of the hollow cathode structure according to the present invention.
Figure 8:
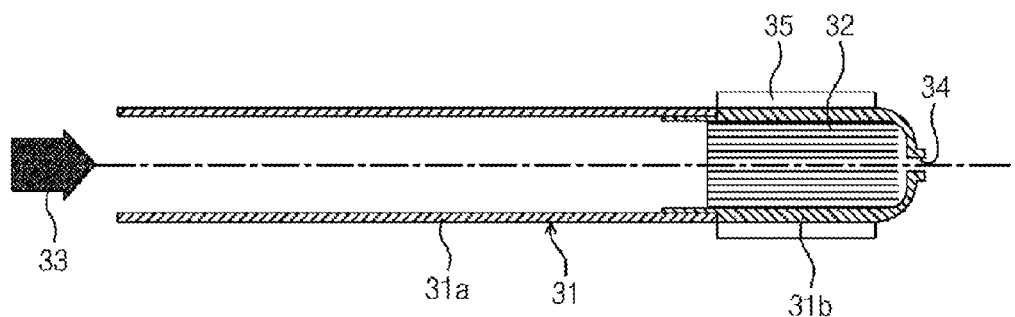
FIG. 8 is a cross sectional view illustrating another embodiment of the hollow cathode structure according to the present invention.
Figure 9:
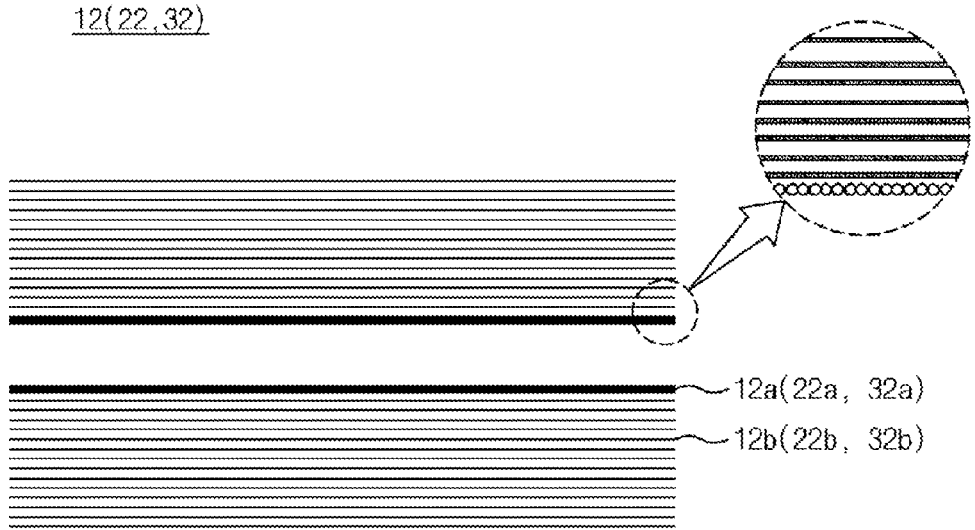
FIGS. 9 and 10 are cross sectional views illustrating the insert constituting the hollow cathode structure according to the present invention.
Figure 10:
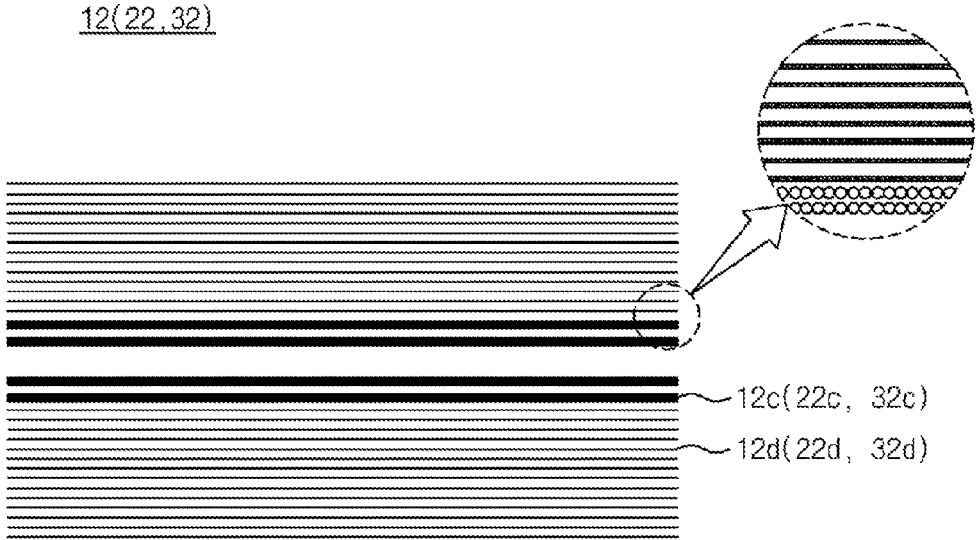
Figure 11:
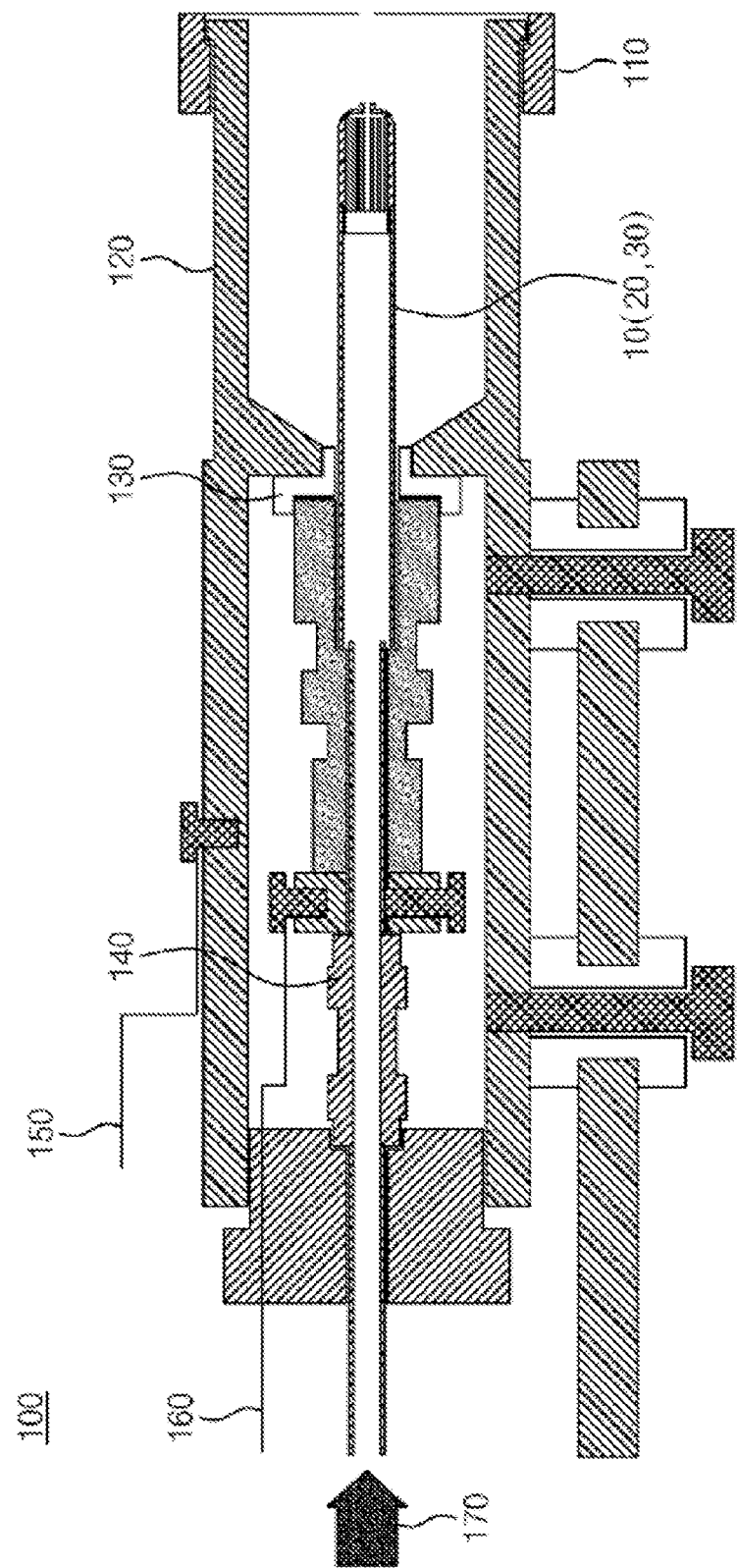
FIG. 11 is a view illustrating the cathode system applying the high efficiency hollow cathode according to the present invention.
Figure 12:
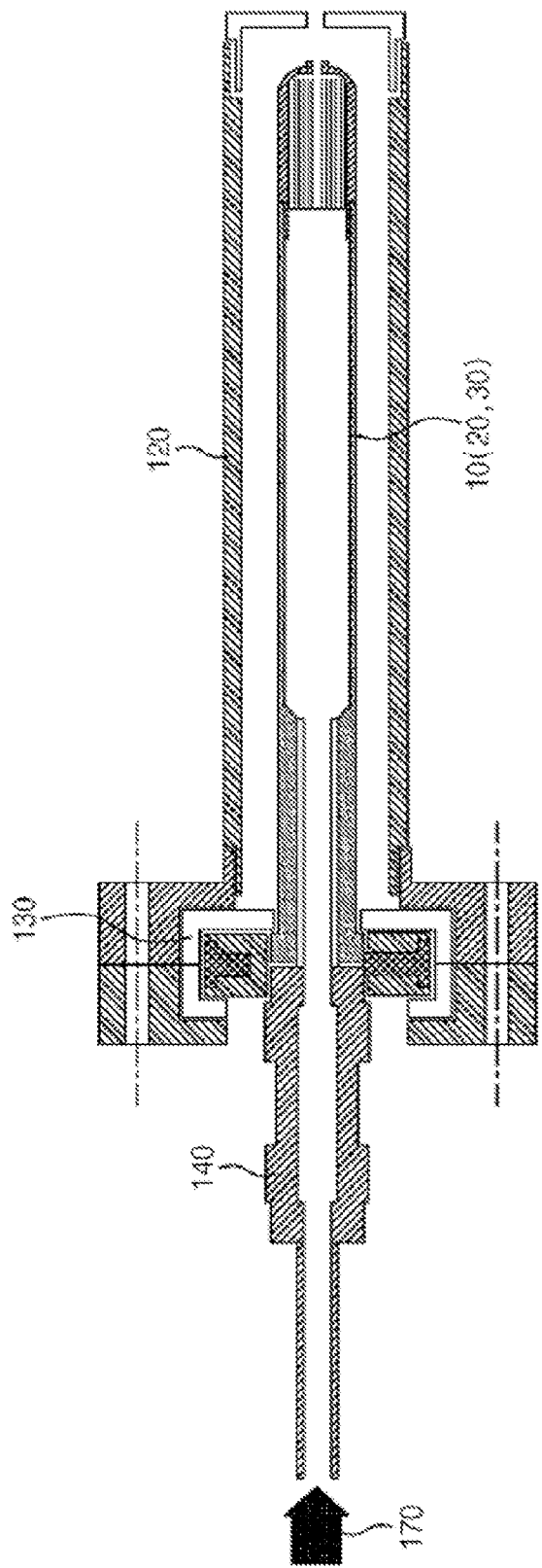
FIG. 12 is a view illustrating another embodiment of the cathode system applying the high efficiency hollow cathode according to the present invention.
Figure 13:
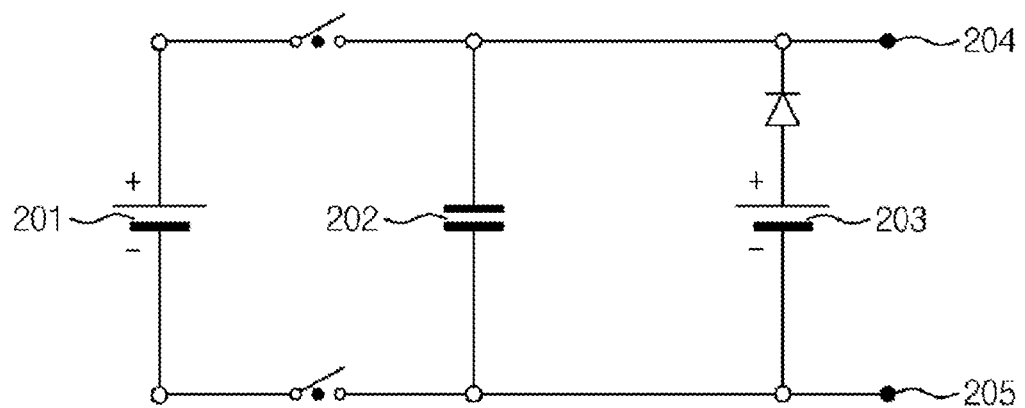
FIG. 13 is an electric circuit diagram briefly illustrating the power unit of the hollow cathode system according to an embodiment of the present invention.

Hereinafter, the constitution of the present invention is explained with reference to the accompanying drawings. FIG. 6 is a cross sectional view illustrating the hollow cathode structure according to the present invention. FIG. 7 is a cross sectional view illustrating another embodiment of the hollow cathode structure according to the present invention. FIG. 8 is a cross sectional view illustrating another embodiment of the hollow cathode structure according to the present invention. FIGS. 9 and 10 are cross sectional views illustrating the insert constituting the hollow cathode structure according to the present invention. FIG. 11 is a view illustrating the cathode system applying the high efficiency hollow cathode according to the present invention. FIG. 12 is a view illustrating another embodiment of the cathode system applying the high efficiency hollow cathode according to the present invention. FIG. 13 is an electric circuit diagram briefly illustrating the power unit of the hollow cathode system according to an embodiment of the present invention.

The hollow cathode 10 according to an embodiment of the present invention comprises a tube 11 comprising two parts 11a and 11b, a gas providing unit 13 and a gas outlet 14 which are respectively formed at the distal ends of the tube 11, and an insert 12 mounted inside the tube 11.

Also, parts 11a and 11b constituting the tube 11 may be made of materials different from each other. A first part 11a adjacent to the gas providing unit 13 uses a refractory metal material with low thermal conductivity to reduce heat loss by thermal conduction, and a second part 11b adjacent to the election discharge hole uses a refractory metal with a high melting point to prevent damage by heat. As illustrated in FIG. 6, the tube parts 11a, 11b are integrally connected to each other in a longitudinal direction.

Here, the first part 11a selectively uses titanium, etc. with low thermal conductivity, and the second part 11b selectively uses tantalum, etc. with a high melting point.

Next, an insert 12 mounted inside the tube 11, which performs the role of a thermal radiation shielding layer with respect to the surface discharging internal thermal electron may be formed of at least one layer (for example, 15 layers) of a thin (for example, a thickness of 0.013 mm) tantalum foil.

Also, the insert 12 may be formed as illustrated in FIGS. 9 and 10.

First, an insert 12 illustrated in FIG. 9 may comprise an inner insert 12a comprising a thin wire (for example, a diameter of 0.025 mm) layer winding the insert in the form of solenoid, and a shielding layer 12b mounted outside the inner insert 12a.

That is, the inner insert 12a is made of a thin wire to reduce damage by ion bombardment while increasing the effective surface area discharging thermal electrons, so as to increase the amount of current discharging thermal electrons at the same temperature. Also, the shielding layer 12b may reduce thermal radiation loss of the inner insert 12a.

Also, an insert 12 illustrated in FIG. 10 comprises the innermost two layers 12c and 12d in a thin wire layer to reduce damage by ion bombardment and increase the amount of current discharging thermal electrons by the increase of effective surface area, so as to enhance the performance of the cathode.

The hollow cathode structure 20 according to another embodiment of the present invention comprises a tube 21 comprising at least two refractory metal parts 21a, 21b and 21c, a gas providing unit 23 and a gas outlet 24 which are respectively formed at the distal ends of the tube 21, and an insert 22 mounted inside the tube 21.

Also, an example where a first part 21a and a second part 21b constituting the tube 21 of the present invention are formed of the same material, and a third part 21c is formed of a different material will be explained.

In this case, the first part 21a and the second part 21b not only may be formed of the same thickness and diameter, but may also be formed of different thicknesses as illustrated in the drawing.

That is, the first and second parts 21a and 21b constituting the tube 21 use a refractory metal material with low thermal conductivity to reduce heat loss by thermal conduction, and the third part 21c adjacent to the electron discharge hole uses a refractory metal material with a high melting point to prevent damage by heat.

Here, the first and second parts 21a and 21b selectively use titanium, etc. with low thermal conductivity, and the third part 21c selectively uses tantalum, etc. with a high melting point.

Next, an insert 22 mounted inside the tube 21, which performs the role of a thermal radiation shielding layer with respect to the surface discharging internal thermal electron may be formed of at least one layer (for example, 15 layers) of a thin (for example, a thickness of 0.013 mm) tantalum foil.

Also, the insert 22 may be formed as illustrated in FIGS. 9 and 10.

First, an insert 22 illustrated in FIG. 9 may comprise an inner insert 22a comprising a thin wire (for example, a diameter of 0.025 mm) layer winding the insert in the form of solenoid, and a shielding layer 22b mounted outside the inner insert 22a.

That is, the inner insert 22a is made of a thin wire to reduce damage by ion bombardment while increasing the effective surface area discharging thermal electrons, so as to increase the amount of current discharging thermal electrons at the same temperature. Also, the shielding layer 22b may reduce thermal radiation loss of the inner insert 22a.

Also, an insert 22 illustrated in FIG. 10 comprises the innermost two layers 22c and 22d in a thin wire layer to reduce damage by ion bombardment and increase the amount of current discharging thermal electrons by the increase of effective surface area, so as to enhance the performance of the cathode.

Next, the hollow cathode structure 30 according to another embodiment of the present invention comprises a tube 31 comprising two parts 31a and 31b, a gas providing unit 33 and a gas outlet 34 which are respectively formed at the distal ends of the tube 31, and an insert 32 mounted inside the tube 31.

Also, parts 31a and 31b constituting the tube 31 may be made of materials different from each other. A first part 31a adjacent to the gas providing unit 33 uses a refractory metal material with low thermal conductivity to reduce heat loss by thermal conduction, and a second part 31b adjacent to the electron discharge hole uses a refractory metal material with a high melting point to prevent damage by heat.

Here, the first part 31a selectively uses titanium, etc. with low thermal conductivity, and the second part 31b selectively uses tantalum, etc. with a high melting point.

Also, a thermal radiation shielding layer 35 is formed at certain intervals in the outer surface of the second part 31b.

To explain this in more detail, the thermal radiation shielding layer 35 is formed at certain intervals in the outer surface of the second part 31b where the insert 32 is located so as to reduce heat loss by thermal radiation of the high temperature region.

Next, an insert 32 mounted inside the tube 31, which performs the role of a thermal radiation shielding layer with respect to the surface discharging internal thermal electron may be formed of at least one layer (for example, 15 layers) of a thin (for example, a thickness of 0.013 mm) tantalum foil.

Also, the insert 32 may be formed as illustrated in FIGS. 9 and 10.

First, an insert 32 illustrated in FIG. 9 may comprise an inner insert 32a comprising a thin wire (for example, a diameter of 0.025 mm) layer winding the insert in the form of solenoid, and a shielding layer 32b mounted outside the inner insert 32a.

That is, the inner insert 32a is made of a thin wire to reduce damage by ion bombardment while increasing the effective surface area discharging thermal electrons, so as to increase the amount of current discharging thermal electrons at the same temperature. Also, the shielding layer 32b may reduce thermal radiation loss of the inner insert 32a.

Also, an insert 32 illustrated in FIG. 10 comprises the innermost two layers 32c and 32d in a thin wire layer to reduce damage by ion bombardment and increase the amount of current discharging thermal electrons by the increase of effective surface area, so as to enhance the performance of the cathode.

The cathode system 100 according to an embodiment of the present invention (hereinafter, "cathode system") comprises a body 120; a keeper 110 electrically connected to one end of the body 120; a hollow cathode 10, 20 and 30 mounted in the body 120; an injection hole 170 injecting gas to the hollow cathode 10, 20 and 30; a ceramic structure 130 coinciding the hollow cathode 10, 20 and 30 with the center of the keeper 110; and a wire 150 and 160 connected to the body 120, the wire 150 and 160 providing a large potential difference between the keeper 110 and the hollow cathode 10, 20 and 30.

Also, the keeper 110 and body 120 are electrically connected to be equipotential, and the hollow cathode 10, 20 and 30 applied with a relatively negative potential is electrically separated.

Also, the body 120 is electrically insulated from the hollow cathode 10, 20 and 30, and in order to fix the hollow cathode 10, 20, 30 to coincide with the center axis of the keeper 110, a ceramic structure 130 stable at high temperature and an insulation tube 140 such as cryogenic break may be used.

Next, for initial discharge, according to the cathode system 100, gas of high flow is injected through the injection hole 170, and a potential with a great potential difference (for example, 700 V) is applied to the keeper 110 and cathode 10, 20 and 30, respectively through two wires 150 and 160.

In this case, according to the conventional structure, an insulation tube 140 is located outside the body so that the potential applied to the cathode 10, 20 and 30 during initial discharge is exposed to the outside, and thus there is a problem in electric stability (the potential is discharged at the gas providing tube and damaged, etc.). In comparison, the present invention can solve this problem through an insulation tube 140 installed inside the body 120.

FIG. 12 illustrated next illustrates another embodiment of the cathode system. The cathode system 100 comprises a body 120; a keeper 110 electrically connected to one end of the body 120; a hollow cathode 10, 20 and 30 mounted in the body 120; and an injection hole 170 injecting gas to the hollow cathode 10, 20 and 30, etc.

That is, the cathode system illustrated in FIG. 12 is a miniature of the cathode system illustrated in FIG. 11 which has a structure similar thereto.

To explain this in more detail, the cathode system 100 minimizes its structure to reduce weight, so that it can be applied to satellites easily while reducing material. Also, it is formed so that Ti has different diameters to have thermal stability and structural stability at the same time.

Also, the keeper 110 and body 120 are electrically connected to be equipotential, and the hollow cathode 10, 20 and 30 applied with a relatively negative potential is electrically separated.

Also, the body 120 is electrically insulated from hollow cathode 10, 20 and 30, and in order to fix the hollow cathode 10, 20 and 30 to coincide with the center axis of the keeper 110, a ceramic structure 130 stable at high temperature and an insulation tube 140 such as cryogenic break may be used.

Next, for initial discharge, according to the cathode system 100, gas of high flow is injected through the injection hole 170.

FIG. 13 illustrated next is an electric circuit diagram briefly illustrating the power unit 200 of the hollow cathode system according to an embodiment of the present invention.

That is, according to prior art, for initial discharge, power of large capacity (starter power supply) is used, whereas according to the present embodiment, without using power of large capacity, power 201 of small capacity and an electric condenser 202 are used instead of the conventional power of large capacity.

This may be a form economically using the fact that the power for initial discharge is used only for a very short period of time, and after initial discharge, power 203 may be used to maintain the plasma as in prior art.

Here, the cathode 204 and anode 205 may be connected to the connecting line 160 of the hollow cathode 10, 20 and 30 of the hollow cathode system 100, and the connecting line 150 of the keeper 110.

Figure 14A:
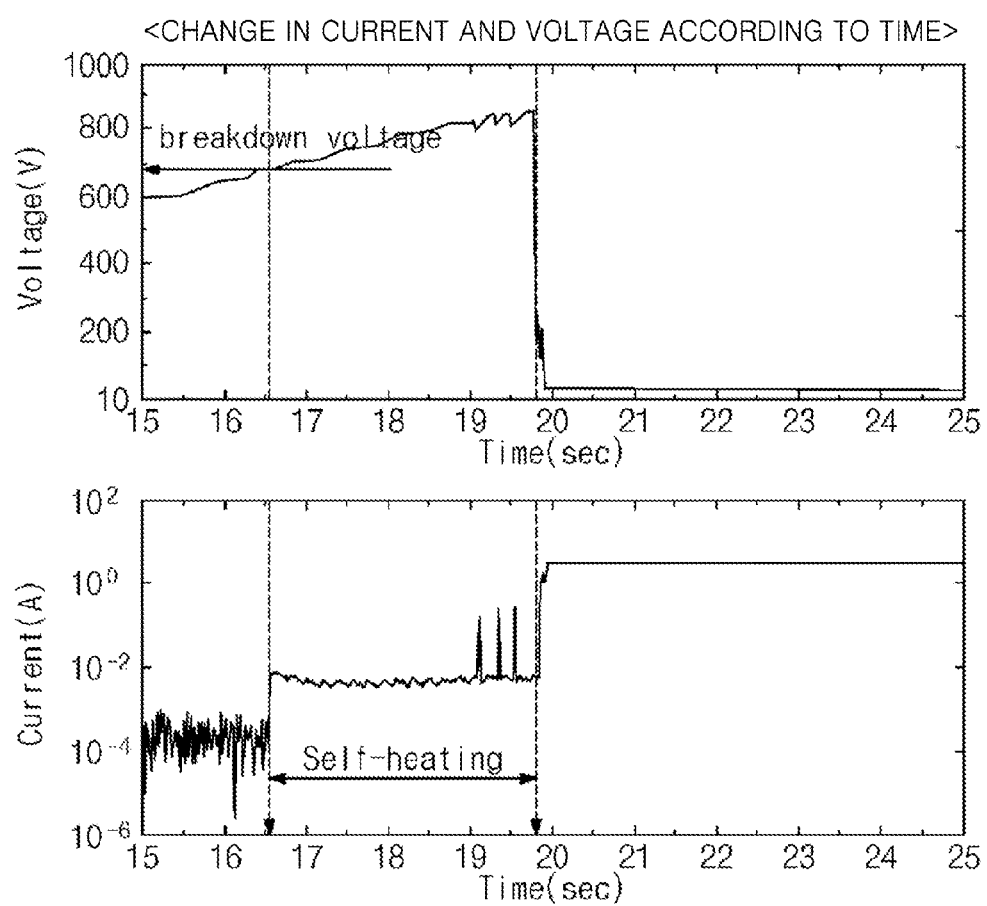
FIGS. 14a and 14b are graphs illustrating the change of voltage and current according to time measured at initial discharge using the conventional industrial hollow cathode in order to determine the capacity of the electric condenser of the power unit of the hollow cathode system according to an embodiment of the present invention.
Figure 14B:
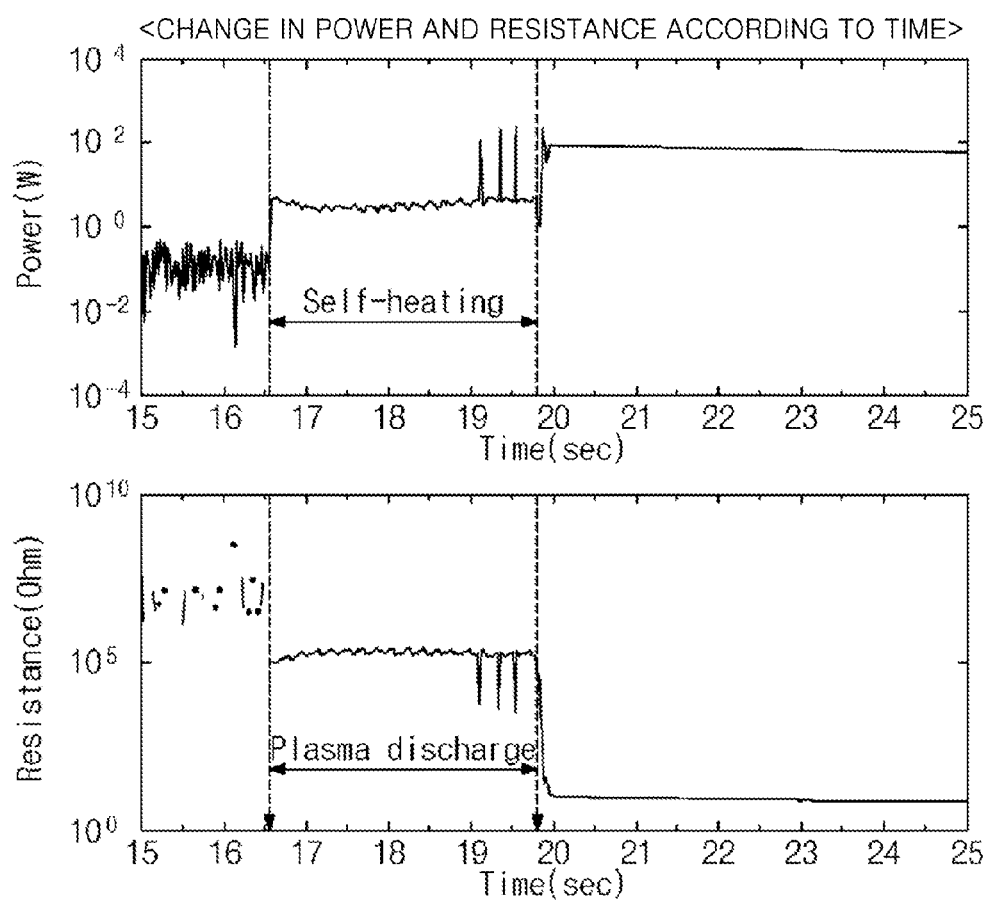

FIGS. 14a and 14b are graphs illustrating the change of voltage and current according to time measured at initial discharge using the conventional industrial hollow cathode in order to determine the capacity of the electric condenser 202 of the power unit of the hollow cathode system 200 according to an embodiment of the present invention. Through them, the change in power and effective resistance according to time may be obtained.

In this case, the voltage applied first increases and then plasma is discharged at a certain voltage (about 700 V) so that a low current (about 4 mA) flows and the cathode is heated. Referring to the change of resistance according to time, it may be seen that the resistance is maintained at a certain level during initial discharge. This shows that the plasma is discharged. The total amount of current flowing during initial discharge and the total energy delivered may be calculated. The capacity of the electric condenser may be selected using these values.

Figure 15A:
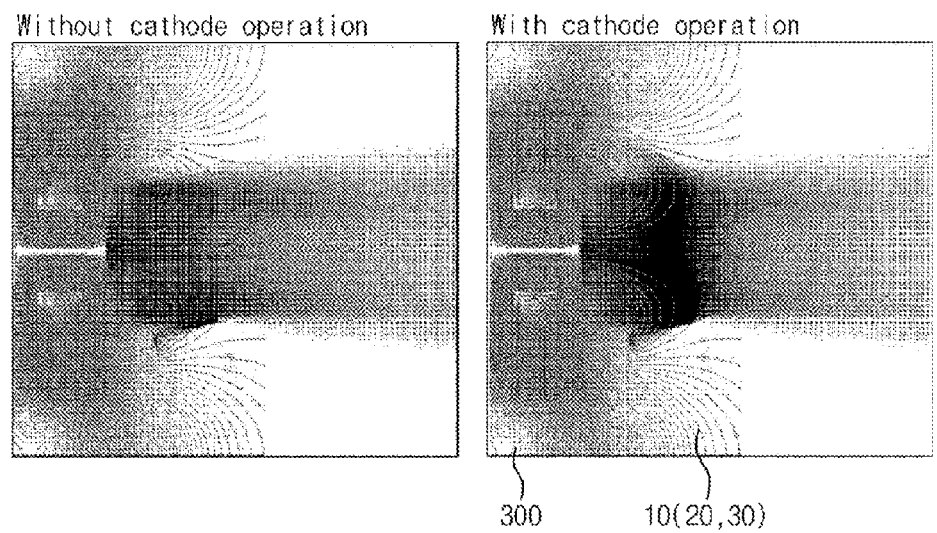

FIG. 15 illustrated next is a graph illustrating the energy distribution function of discharge image and ion beam obtained by applying the hollow cathode 10, 20 and 30 according to an embodiment of the present invention to an ion beam source 300.

To explain this in more detail, in order to examine the effect of the hollow cathode 10, 20 and 30, the case of operating the cathode and not operating the cathode are compared under the same discharge condition of ion beam source 300.

The electron beam created and discharged from the hollow cathode 10, 20 and 30 is distributed along the magnetic field line of the ion beam.

The energy distribution function of the ion beam may be measured by locating a retarding potential analyzer at a location apart in a certain distance (for example, 150 mm) from the ion beam source 300. It can be confirmed that the ion amount of a specific energy (about 0.5 keV) region increased by the electron supplied from the hollow cathode

10, 20 and 30. According to another embodiment of the present invention, by varying the installment method of the hollow cathode 10, 20 and 30 and process conditions, the hollow cathode may be applied in order to control the properties of the energy distribution function of the ion beam source 300 and ion current density.

The hollow cathode may be applied to the process of using ion beams according to another embodiment of the present invention to prevent charging and arcing.

While the present invention has been described with reference to the embodiments of the present invention, it is to be appreciated that various changes and modifications can be made by those skilled in the art without departing from the spirit and scope of the present invention, as defined by the appended claims.

What is claimed is:

1. A hollow cathode comprising: a tube comprising at least two refractory metal parts; a gas providing unit and a gas outlet which are respectively formed at the distal ends of the tube; and an insert mounted inside the tube;
    wherein the tube includes a plurality of tube parts formed of refractory metal materials different from each other and integrally connected to each other in a longitudinal direction; and
    wherein a part adjacent to the gas providing unit is formed of a refractory metal material with low thermal conductivity; and a part adjacent to an electron discharge hole is formed of a refractory metal material with a high melting point.

2. The hollow cathode of claim 1, wherein a first part and a second part of the tube are formed of the same refractory metal material and a third part is formed of a different refractory metal material, and the thickness and diameter of each of the tube part are made to be the same or different.

3. The hollow cathode of claim 1, wherein a thermal radiation insulation layer is formed at an interval in the outer side of the tube where the insert is located.

4. The hollow cathode of claim 1, wherein the tube is formed of a tube part made of titanium, titanium alloy, tantalum material or a combination thereof.

5. The hollow cathode of claim 1, wherein part of or the entire insert is formed of refractory metal wire.

6. The hollow cathode of claim 5, wherein the insert comprises a wire type insert and a foil type insert.

7. The hollow cathode of claim 6, wherein the innermost layer or inner layers are formed of the wire type insert and the outer part thereof is formed of the foil type insert.

8. A cathode system using a high efficiency hollow cathode comprises: a body; a keeper electrically connected to one end of the body; a hollow cathode according to claim 1 mounted in the body; an injection hole injecting gas to the hollow cathode; a ceramic structure coinciding the hollow cathode with the center of the keeper; and a wire connected to the body, the wire providing a large potential difference between the keeper and the hollow cathode.

9. The cathode system of claim 8, wherein the hollow cathode is mounted inside the body, and the cathode is insulated from the gas injection hole so that cathode potential is not exposed outside the body.

10. The cathode system of claim 8, comprising a power unit using an electric condenser for initial discharge.

* * * * *